(12) United States Patent
Edelson

(10) Patent No.: US 11,545,936 B2
(45) Date of Patent: Jan. 3, 2023

(54) AMPLIFIER BIASING TECHNIQUES

(71) Applicant: Analog Devices, Inc., Norwood, MA (US)

(72) Inventor: Lawrence Howard Edelson, Fremont, CA (US)

(73) Assignee: Analog Devices, Inc., Norwood, MA (US)

(*) Notice: Subject to any disclaimer, the term of this patent is extended or adjusted under 35 U.S.C. 154(b) by 222 days.

(21) Appl. No.: 16/562,702

(22) Filed: Sep. 6, 2019

(65) Prior Publication Data

US 2021/0075370 A1 Mar. 11, 2021

(51) Int. Cl.
 *H03F 1/02* (2006.01)
 *H03F 3/26* (2006.01)

(52) U.S. Cl.
 CPC .......... *H03F 1/0211* (2013.01); *H03F 3/265* (2013.01)

(58) Field of Classification Search
 CPC .......... H03F 1/0211; H03F 3/265; H03F 3/45; H03F 1/0272; H03F 1/0205; H03F 1/086; H03F 1/42; H03F 3/45192; H03F 3/303; H03F 2203/45112
 USPC .................................. 330/252–261
 See application file for complete search history.

(56) References Cited

U.S. PATENT DOCUMENTS

| | | | |
|---|---|---|---|
| 5,212,455 A | 5/1993 | Pemici et al. | |
| 5,361,041 A | 11/1994 | Lish | |
| 6,388,523 B1 | 5/2002 | Kappes | |
| 6,714,076 B1 * | 3/2004 | Kalb | H03F 1/483 330/255 |
| 7,098,736 B2 | 8/2006 | Mizoe | |
| 7,129,785 B1 | 10/2006 | Nilson | |
| 7,271,663 B2 * | 9/2007 | Baum | H03F 3/3028 330/311 |
| 7,872,531 B1 | 1/2011 | Dhanasekaran | |
| 7,920,027 B2 | 4/2011 | Keerti | |

(Continued)

FOREIGN PATENT DOCUMENTS

| | | |
|---|---|---|
| JP | 5974998 B2 | 8/2016 |
| WO | WO-2015117950 A1 | 8/2015 |

OTHER PUBLICATIONS

Dammak, H. Daoud, et al., "Design of Folded Cascode OTA in Different Regions of Operation through g(m)/I(D) Methodology", World Academy of Science, Engineering and Technology, 45, (2008), 28-33.

(Continued)

*Primary Examiner* — Samuel S Outten
*Assistant Examiner* — Khiem D Nguyen
(74) *Attorney, Agent, or Firm* — Schwegman Lundberg & Woessner, P.A.

(57) ABSTRACT

Techniques for biasing output transistor of a push-pull amplifier output stage are provided. In certain applications the techniques can improve efficiency of the amplifier. In an example, a circuit can include an output stage including first and second output transistors, a first scaled replica transistor corresponding to the first output transistor, and an amplifier circuit in a feedback arrangement for biasing a gate of the first output transistor at a level that, at a specified stand-by current level of the first output transistor, reproduces a voltage difference between the drain and source terminals of the first output transistor across the drain and source terminals of the first replica transistor.

15 Claims, 4 Drawing Sheets

(56) References Cited

U.S. PATENT DOCUMENTS

| | | | |
|---|---|---|---|
| 8,344,797 B2 | 1/2013 | Crespi et al. | |
| 8,400,220 B1 | 3/2013 | Joffe et al. | |
| 8,766,722 B2 * | 7/2014 | Galal | H03F 3/3022 330/269 |
| 10,312,872 B2 | 6/2019 | D'souza et al. | |
| 2008/0278232 A1 * | 11/2008 | Sung | H03F 3/45219 330/255 |

OTHER PUBLICATIONS

Devi, P. Ambica, et al., "Implementation of an Efficient Class-AB OP-Amps with High and Symmetrical Slew Rate Using H-Spice", Intl Journal of Advanced Technology in Engineering and Science (IJATES), 4(7), (Jul. 2016), 196-206.

Singh, Tapsi, et al., "Design and Analysis of MCOS Folded Cascode OTA Using G(m)/I(D) Technique", Intl Journal of Electronics and Computer Science Engineering, 1(2), (2012), 727-733.

Vadadoria, Mu, et al., "Design and Implementation of High Gain, High Unity Gain Bandwidth, High Slew Rate and Low Power Dissipation CMOS Folded Cascode OTA for Wide Band Applications", Journal of Electrical and Electronic Systems, 4(2), (2015), 5 pgs.

\* cited by examiner

AMPLIFIER BIASING TECHNIQUES

TECHNICAL FIELD OF THE DISCLOSURE

The present disclosure is related to amplifiers and more particularly techniques to provide improved biasing of output transistors of an amplifier to conserve power.

BACKGROUND

The output stage of certain AB amplifiers often are composed of large width, minimum-channel-length complimentary NMOS and PMOS power transistors. Diode-connected field-effect transistors (FETs) are often used as ratio replica devices to produce level shifts that are used to set the gate voltage of the output devices and the class AB offset gate voltage. These replica devices do not adequately model the actual drain-to-source voltage of the power transistors and consequently lead to higher than expected stand-by current of the output stage, and excessive dependence of the stand-by current on supply voltage.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
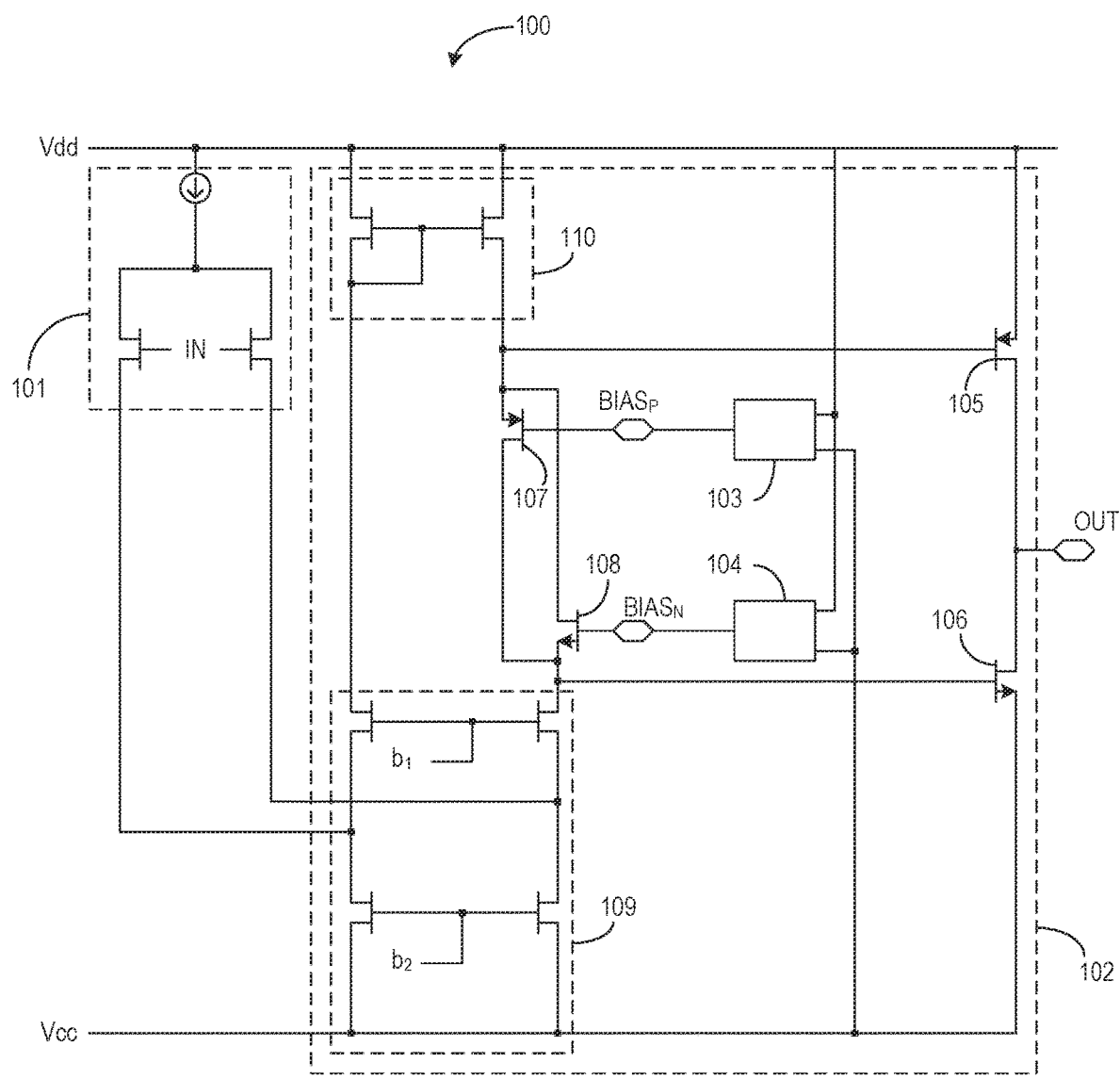
FIG. 1 illustrates generally an amplifier including an example bias configuration for an output stage.

The present inventors have recognized improved techniques for providing a desired bias to one or more transistors of an amplifier stage such as the output transistors of an amplifier. In certain examples, the techniques can be applied to, but are not limited as such, an AB-type amplifier or other amplifier types employing a push-pull stage. The techniques provided are an improvement over conventional biasing techniques, such as a basic Monticelli bias technique, because the biasing is better tuned for the voltage found across a corresponding output transistor. Such conventional techniques can include using a pair of complementary offset transistors, coupled in parallel, and coupled to the control nodes of the output transistors. The control node of each offset transistor can be coupled to an independent bias circuit that includes a current source, coupled in series with diode-connected replica transistors, between the supply rails (Vdd, Vcc) of the output transistors. A first replica transistor can be a scaled replica of the corresponding offset transistor and a second replica transistor can be a scaled replica of the corresponding output transistor. For many applications, conventional bias techniques allow for stand-by current in the output transistors even when the load is high impedance, thus, each amplifier can be active even when the load is receiving little if any current. Keeping the output transistors active can allow for better bandwidth of the output stage. However, for certain configurations, the stand-by current provided by the bias circuit can be much higher than desired and can negatively affect efficiency especially when the current demand from the load is very low. For example, the basic Monticelli technique described above provides a bias voltage of approximated two threshold voltages with the voltage across the replica output transistor of about one threshold voltage. In general, it is desirable that the voltage across the replica output transistor match the voltage across the actual output transistor during the stand-by condition.

For example, the output stage of a power amplifier can often be composed of large width, minimum-channel-length complimentary NMOS and PMOS field-effect transistors (FETs). In conventional bias schemes, diode-connected FETS are used as ratio replica devices to produce the level shifts that are used to set the gate voltage of the output devices and the offset gate voltage. Unfortunately, the replica FETs do not adequately model the actual drain source voltage of the power FETs and consequently do not account for the impact of the limited output impedance of the FETs on stand-by current. The techniques described below embeds the replica transistors in an amplifier loop that imposes the proper drain-source voltage as well as the ratio of the stand-by current to obtain the correct gate voltage for the desired stand-by current. In addition, a second diode-connected device is included in the amplifier load path to produce the required offset from the replica gate voltage to set the offset gate voltage. Complementary amplifier circuits are used for the NMOS and PMOS biasing.

FIG. 1 illustrates generally an amplifier 100 including an example bias configuration for an output stage. The amplifier 100 can include an input stage 101, the output stage 102, and example bias circuits 103, 104. In certain examples, the input stage 101 can receive an input signal (IN) and the output stage 102 can provide an amplified version as an output signal (OUT). The output stage 102 can include a first output transistor 105 and a second output transistor 106 coupled in series between two supply rails (Vdd, Vcc). In certain examples, the output stage 102 can be a push-pull output stage such that the first output transistor 105 is a p-channel transistor and the second output transistor 106 is a n-channel transistor. The control nodes of the first and second output transistors 105, 106 can be coupled to a respective offset transistor 107, 108. The output stage 102 can include a folded-cascode stage 109 with a current mirror 110. The folded-cascode stage 109 can receive the output of the input stage 101 and can be couple to the offset transistors 107, 108. The control nodes of the offset transistors 107, 108 can be coupled to corresponding bias circuits 103, 104 configured to maintain the output transistors 105, 106 in an active conduction state while minimizing current during a stand-by condition when the current demand of a load coupled to an output node of the output stage is quite small. Such biasing can always keep the output transistors active (e.g., conducting current) even if there is little or no-load current.

Figure 2:
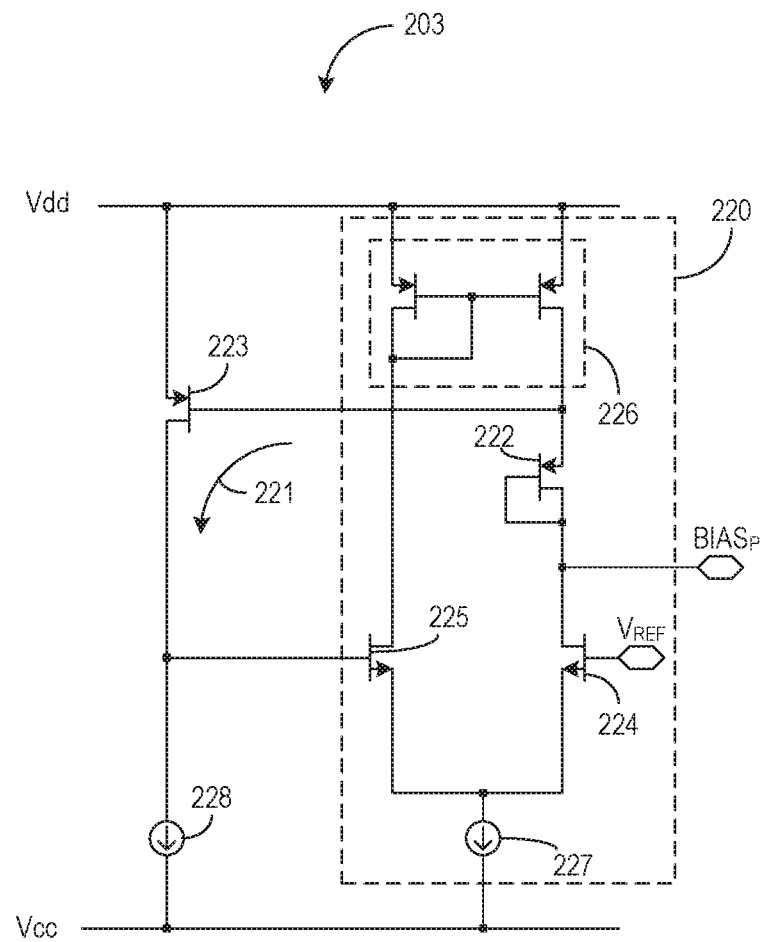
FIG. 2 illustrates generally an example bias circuit for the p-channel output transistor of FIG. 1 and provides a control signal (BIAS$_P$) for the corresponding offset transistor.
Figure 3:
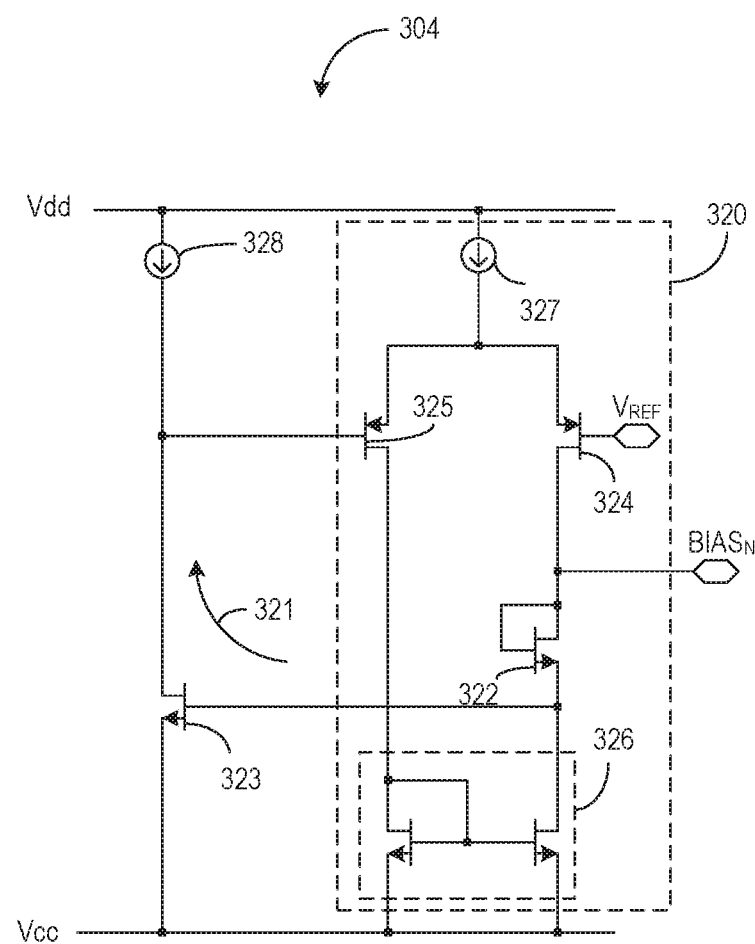
FIG. 3 illustrates generally an example bias circuit for the n-channel output transistor of FIG. 1 and provides a control signal (BIAS$_N$) for the corresponding offset transistor.

FIGS. 2 and 3 illustrate generally complimentary example bias circuits 203, 204 for biasing the output transistors 105, 106 of FIG. 1. FIG. 2 illustrates generally an example bias circuit 203 for the p-channel output transistor 105 and provides a control signal (BIAS$_P$) for the corresponding offset transistor 107. The bias circuit 203 can include a bias amplifier 220 and a feedback path 221. The bias circuit can include two replica transistors 222, 223. The first replica transistor 222 can be a scaled version of the corresponding offset transistor (FIG. 1, 107), and the second replica transistor 223 can be a scaled version of the corresponding output transistor (FIG. 1, 105). The bias amplifier 220 can include a pair of differential input transistors 224, 225, a current mirror 226 and a first current source 227. The first replica transistor 222 can be in a diode-coupled arrangement and connected in series with a first one of the input transistors 224 and the mirror transistor of the current mirror 226. In certain examples, the first current source 227 can be a scaled version of the current of the corresponding offset transistor (e.g., FIG. 1, 107). For example, if the first replica transistor 222 is ⅒ of the corresponding offset transistor, then the current in the first replica transistor 222 can be ⅒ of the current of the corresponding offset transistor to operate at the same current density. That means (since the current divides evenly through the diff pair branches) that the current source 227 can provide ⅕ of the current in the corresponding offset transistor.

The feedback path 221 can include the second replica transistor 223 coupled in series with a second current source 228. A control node of the second input transistor 225 can be coupled to a node of the feedback path 221 that couples the second replica transistor 223 with the second current source 228. A control node of the second replica transistor 223 can be coupled to a node that couples the first replica transistor 222 with a mirror transistor of the current mirror 226. In certain examples, the second current source 228 can provide a scaled current of the stand-by current of the corresponding output transistor (e.g., FIG. 1, 105). For example, if the second replica transistor 223 is ¹⁄₁₀₀₀ of the corresponding output transistor, the current provided by the second current source 228 can be about ¹⁄₁₀₀₀ the stand-by current.

A control node of the first input transistor 224 of the bias amplifier can be configured to receive a setpoint voltage ($V_{SP}$) representative of a voltage across the corresponding output transistor (e.g., FIG. 1, 105). The first replica transistor 222 and the second replica transistor 223 can provide feedback to equalize the voltage at the control node of the second input transistor 225 of the bias amplifier 220. The output signal of the bias amplifier 220 can provide a bias command signal ($BIAS_P$) for the corresponding offset transistor (e.g., FIG. 1, 107) that can keep the corresponding output transistor (e.g., FIG. 1, 105) active (e.g., conducting current). By acting in the feedback arrangement described above, the second replica transistor 223 can operate at the desired drain-source voltage (e.g., approximately the drain-source voltage of the corresponding output transistor) that matches the amplifier output voltage (OUT) at quiescent conditions. The gate voltage of the second replica transistor 223 can be set by the drain of the active load for the input pair (e.g., the diode-connected first replica transistor 222) and can represent the desired gate voltage for the corresponding output transistor (e.g., FIG. 1, 105). As such, the desired gate voltage can properly account for the non-ideal effects of a finite output impedance. It is noted that the insertion of the diode-connected first replica transistor 222 in the branch of the bias amplifier 220 coupled to the control node of the second replica transistor 223 can ensure that the proper offset voltage is created for controlling the corresponding offset transistor (e.g., FIG. 1, 107).

FIG. 3 illustrates generally an example bias circuit 304 for the n-channel output transistor (FIG. 1; 106) and provides a control signal ($BIAS_N$) for the corresponding offset transistor (FIG. 1, 108). The bias circuit 304 can include a bias amplifier 320 and a feedback path 321. The bias circuit 304 can include two replica transistors 322, 323. The first replica transistor 322 can be a scaled version of the corresponding offset transistor (FIG. 1, 108), and the second replica transistor 323 can be a scaled version of the corresponding output transistor (FIG. 1, 106). The bias amplifier 320 can include a pair of differential input transistors 324, 325, a current mirror 326 and a first current source 327. The first replica transistor 322 can be in a diode-coupled arrangement and connected in series with a first one of the input transistors 324 and the mirror transistor of the current mirror 326. In certain examples, the first current source 327 can be a scaled version of the current of the corresponding offset transistor (e.g., FIG. 1, 108). For example, if the first replica transistor 322 is ⅒ of the corresponding offset transistor, then the current in the first replica transistor 322 can be ⅒ of the current of the corresponding offset transistor to operate at the same current density. That means (since the current divides evenly through the diff pair branches) that the current source 327 can provide ⅕ of the current in the corresponding offset transistor.

The feedback path 321 can include the second replica transistor 323 coupled in series with a second current source 328. A control node of the second input transistor 325 can be coupled to a node of the feedback path 321 that couples the second replica transistor 323 with the second current source 328. A control node of the second replica transistor 323 can be coupled to a node that couples the first replica transistor 322 with a mirror transistor of the current mirror 326. In certain examples, the second current source 228 can provide a scaled current of the stand-by current of the corresponding output transistor (e.g., FIG. 1, 105). For example, if the second replica transistor 223 is ¹⁄₁₀₀₀ of the corresponding output transistor, the current provided by the second current source 228 can be about ¹⁄₁₀₀₀ the stand-by current.

A control node of the first input transistor 324 of the bias amplifier can be configured to receive a setpoint voltage ($V_{SP}$) representative of a voltage across the corresponding output transistor (e.g., FIG. 1, 106). The first replica transistor 322 and the second replica transistor 323 can provide feedback to equalize the voltage at the control node of the second input transistor 325 of the bias amplifier 320. The output signal of the bias amplifier 320 can provide a bias command signal ($BIAS_N$) for the corresponding offset transistor (e.g., FIG. 1, 108) that can keep the corresponding output transistor (e.g., FIG. 1, 106) active (e.g., conducting current). By acting in the feedback arrangement described above, the second replica transistor 323 can operate at the desired drain-source voltage (e.g., approximately the drain-source voltage of the corresponding output transistor) that matches the amplifier output voltage (OUT) at quiescent conditions. The gate voltage of the second replica transistor 323 can be set by the drain of the active load for the input pair (e.g., the diode-connected first replica transistor 322) and can represent the desired gate voltage for the corresponding output transistor (e.g., FIG. 1, 106). As such, the desired gate voltage can properly account for the non-ideal effects of a finite output impedance. It is noted that the insertion of the diode-connected first replica transistor 322 in the branch of the bias amplifier 320 coupled to the control node of the second replica transistor 323 can ensure that the proper offset voltage is created for controlling the corresponding offset transistor (e.g., FIG. 1, 108).

With respect to the examples of FIGS. 2 and 3, the scaled current sources (e.g., 227, 228, 327, 328) can be independent which can allow for more flexibility over conventional Monticello biasing schemes. In certain examples, each of the second replica transistors, 223, 323 can include a compensation circuit coupled between the respective drain and gate to assist with stability.

Figure 4:
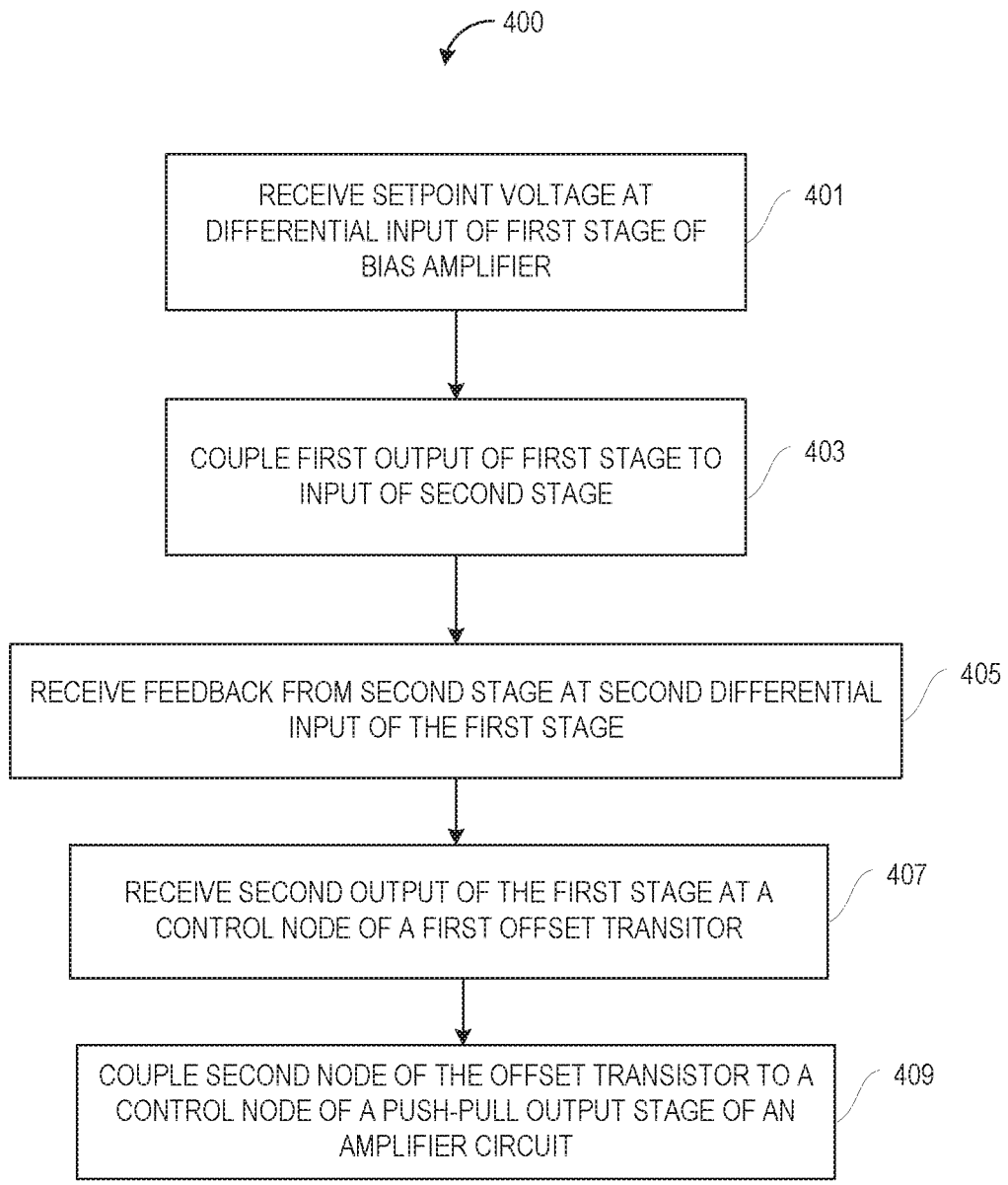
FIG. 4 illustrates generally an example method of operating an amplifier bias circuit and for biasing output transistors of a push-pull output stage according to the present subject matter.

FIG. 4 illustrates generally an example method 400 of operating an amplifier bias circuit and for biasing output transistors of a push-pull output stage according to the present subject matter. At 401, a setpoint voltage can be received at a differential input of a first stage of a bias amplifier. At 403, a first output of the first stage can be coupled to an input of a second stage of the first bias amplifier. At 405, feedback from the second stage can be received at a second differential input of the first stage. At 407, a second output of the first stage can be received at a control node of a first offset transistor. At 409, a second node of the offset transistor can be coupled to a control node of a first output transistor of a push-pull output stage of an amplifier including the amplifier bias circuit.

VARIOUS NOTES & EXAMPLES

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, the terms "including" and "comprising" are open-ended, that is, a system, device, article, composition, formulation, or process that includes elements in addition to those listed after such a term are still deemed to fall within the scope of subject matter discussed. Moreover, such as may appear in a claim, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of a claim. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. The following aspects are hereby incorporated into the Detailed Description as examples or embodiments, with each aspect standing on its own as a separate embodiment, and it is contemplated that such embodiments can be combined with each other in various combinations or permutations.

What is claimed is:

1. A circuit, comprising:
   a push-pull output stage including first and second output transistors;
   a first replica transistor comprising a scaled-down replica transistor of the first output transistor; and
   a first amplifier circuit in a feedback arrangement configured to bias a gate of the first output transistor, wherein the first amplifier circuit includes the first replica transistor, a first offset transistor coupled between control nodes of the first and second output transistors, and a second replica transistor comprising a scaled-down replica transistor of the first offset transistor, wherein the first replica transistor is diode-connected and coupled to a control node of the first offset transistor.

2. The circuit of claim 1, including the second replica transistor corresponding to the second output transistor.

3. The circuit of claim 2, including a second amplifier circuit in a feedback arrangement for biasing a gate of the second output transistor at a level that, at a specified stand-by current level of the second output transistor, reproduces a voltage difference between drain and source terminals of the second output transistor across drain and source terminals of the second replica transistor.

4. The circuit of claim 3, wherein the second amplifier circuit includes the second replica transistor.

5. The circuit of claim 1, wherein the first amplifier circuit is configured to bias the gate of the first output transistor at a level that, at a specified stand-by current level of the first output transistor, reproduces a voltage difference between drain and source terminals of the first output transistor across drain and source terminals of the first replica transistor.

6. The circuit of claim 1, wherein the first amplifier circuit includes a second offset transistor coupled in parallel with the first offset transistor.

7. The circuit of claim 6, including a third replica transistor corresponding to the second output transistor.

8. The circuit of claim 7, including a second amplifier circuit in a feedback arrangement for biasing a gate of the second output transistor at a level that, at a specified stand-by current level of the second output transistor, reproduces a voltage difference between drain and source terminals of the second output transistor across drain and source terminals of the third replica transistor.

9. The circuit of claim 8, wherein the second amplifier circuit includes a fourth replica transistor corresponding to the second offset transistor, wherein the fourth replica transistor is diode-connected and coupled to a control node of the second offset transistor.

10. A circuit for biasing a first output transistor of an amplifier output stage, the circuit comprising:
    a first offset transistor configured to provide a control signal to the first output transistor of the amplifier output stage; and
    a first bias circuit configured to provide a control signal to the first offset transistor, the first bias circuit including an amplifier circuit configured to equalize a voltage level of a first current source with a setpoint voltage, wherein the amplifier circuit includes a first replica transistor coupled in series between an input supply and the first current source, wherein the first replica transistor is a scaled-down replica transistor of the first output transistor, and wherein the bias circuit includes a second replica transistor that is a scaled-down replica transistor of the first offset transistor and the first replica transistor is diode-connected and configured to provide a control signal to the first offset transistor.

11. The circuit of claim 10, wherein a first input transistor of the amplifier circuit is configured to receive a setpoint voltage and a control node of a second input transistor of the amplifier circuit is configured to couple to the second replica transistor.

12. A method of biasing output transistors of a push-pull output stage, the method comprising:
 receiving a setpoint voltage at a differential input of a first stage of a first biasing amplifier;
 receiving a first output of the first stage at an input of a second stage of the first biasing amplifier;
 receiving feedback from the second stage at a second differential input of the first stage;
 offsetting the first output of the first stage from a second output of the first stage using a diode-connected first replica transistor, wherein the diode-connected second replica transistor is a scaled representation of a first offset transistor;
 receiving the second output of the first stage at a control node of the first offset transistor; and
 coupling a second node of the first offset transistor to a control node of a first output transistor of the push-pull output stage.

13. The method of claim 12, wherein receiving feedback from the second stage includes:
 biasing a second replica transistor having a control node configured to receive the first output of the first stage; and
 coupling a second node of the second replica transistor to the second differential input of the first stage.

14. The method of claim 13, wherein the second replica transistor is a scaled representation of the first output transistor.

15. The circuit of claim 10, wherein the amplifier output stage is a push-pull output stage comprising the first output transistor and a second output transistor.

* * * * *